United States Patent [19]
Zadoff

[11] Patent Number: 5,471,139
[45] Date of Patent: Nov. 28, 1995

[54] FIBER OPTIC LINE MAGNETOMETER HAVING THERMAL COMPENSATION

[75] Inventor: Leon N. Zadoff, Merrick, N.Y.

[73] Assignee: EMS Development Corporation, Farmingdale, N.Y.

[21] Appl. No.: 83,121

[22] Filed: Jun. 28, 1993

[51] Int. Cl.$^6$ .............................. G01B 7/14; G01B 9/02; G02B 5/14

[52] U.S. Cl. .................. 324/244.1; 324/207.13; 250/227.14

[58] Field of Search .................. 324/244.1, 96, 324/207.13, 207.26; 250/227.14

[56] References Cited

U.S. PATENT DOCUMENTS 4,376,248  3/1983  Giallorenzi et al. .............. 324/96

OTHER PUBLICATIONS

"Elements of Railway Signalling", Pamphlet 1979, General Railway Signal, P.O. Box 20600, Rochester N.Y.
"Magnetic Thin–Film Magnetometers of Magnetic–Field Measurement", H. R. Irons and L. J. Schwee, IEEE Transactions on Magnetics, vol. MAG–8, No. 1, pp. 61–65, Mar. 1972.
"Optical Fiber Sensor Technololgy", T. G. Giallorenzi, J. A. Bucaro, A. Dandridge, G. H. Sigel Jr., H. Cole, S. C. Rahsleigh, and R. G. Priest, IEEE Journal of Quantum Electronics, vol. QE–18, No. 4, pp. 626–665, Apr. 1982.
"Recent Developments in Fiber Optic Magnetostrictive Sensors", F. Bucholtz, D. M. Dagnenais, K. P. Koo, S. Vahra, Proc. S.P.I.E.—Int. Soc. Opt. Eng. (USA), vol. 1367, pp. 226–235 (1991).
"Safety and Automatic Train Control for Rail Rapid Transit Systems", Jul. 1974, Report No. DOTTSC–OST–74–4.
"The Impact of High Temperature Superconductivity on Squid Magnetometers", J. Clarke and R. H. Koch, Science, vol. 242, pp. 217–223 (14 Oct. 1988).

*Primary Examiner*—Walter E. Snow

[57] ABSTRACT

A fiber optic line magnetometer is used in a railway block detection system for detecting the presence of a train, or a portion of a train, within a predetermined block. The fiber optic line magnetometer is positioned in the center of the tracks and runs parallel to the tracks for the entire length of the block. The fiber optic line magnetometer includes a sense arm and a reference arm, each of which includes a fiber optic cable for carrying a light originating from a signal source. Magnetostrictive elements connect to the fiber optic cable in the sense arm and change the light path length when external magnetic fields are applied thereto. The light exiting from the sense arm and the reference arm are compared, and in the event the fringe shifts in the compared light exceeds predetermined thresholds, a detection control signal is generated. Non-magnetostrictive elements, which are sized to have the same thermal temperature expansion characteristics as the magnetostrictive elements, are attached to the fiber optic cable of the reference arm.

15 Claims, 7 Drawing Sheets

FIBER OPTIC LINE MAGNETOMETER HAVING THERMAL COMPENSATION invention relates to automatic railway train detection and control systems, and more particularly, to methods, apparatuses and systems for utilizing a fiber optic line magnetometer for detecting the presence of a train, or other metal object, positioned within a predetermined block of the railway track.

BACKGROUND OF THE INVENTION

Automated train control systems require accurate, reliable train location information to safely facilitate train regulation (spacing, merging, diverting, etc.). The basis for much of today's automated train control systems is an automated block system, in which the railway track is subdivided into predetermined segments (blocks), and where the presence of a train within a block is detected and appropriate detection control signals formed. The detection control signals are then provided to a signalling/control system which, at a minimum, provides visual indicators to other trains that the block is currently occupied. In more elaborate signalling/control systems, trains can be automatically prevented from entering an occupied block.

The safety of the automated train control system is dependant upon reliable detection of trains within a block. Failure of such detection can result in dangerous, and potentially deadly, accidents. In a first known method (herein referred to as "shunting method") for detecting the presence of a train within a block, each block of track is electrically insulated from the remainder of the track. A relay is connected across the tracks at the end of the block and a voltage is supplied across the tracks at the beginning of the block. Accordingly, while no train is present within the block, the relay is energized thereby forming a block empty detection control signal. However, when a train enters the block, the tracks are short circuited by the wheels and axles of the train, and therefore, the relay is de-energized to form a block occupied detection control signal. This shunting method of detection is described in greater detail in "Safety and Automatic Train Control for Rail Rapid Transit Systems", Jul. 1974, Report No. DOT-TSC-OST-74-4, pgs. B11–B13.

The shunting method is disadvantaged in that loss of shunt, even when the train is within a block, can be experienced for a number of reasons. The loss of shunt may be caused by the formation of an oxide film on the wheel or rail or by debris on the rails, such as fallen leaves, grease, resin, or brake shoe shavings. While these conditions for failure of the shunt method have always existed, advances in train technology have increased the likelihood of such failures. The tracking of newer trains has progressed to such a point that sideways motion of the trains, which traditionally allowed the side of the train wheels to scrape against the tracks thereby removing insulating films or oxide layers, is decreased and the insulating films and oxide layers build up. Further, lighter weight train cars may not exert enough pressure to enhance wheel rail electrical contract.

A second known method of detecting trains within a block (hereinafter "inductive impedance method") utilizes insulated wire loops installed between the rails. An impedance bridge is used to measure the impedance of the loop; the value being dependent on whether or not a large metal object, such as a train occupies the track above the loop. The size of each wire loop, due to various electrical limitations, are generally limited in size to approximately 100 feet, and since a block may be much larger than the wire loops (e.g., depending upon the anticipated train speeds a blocks can be miles long) multiple loops, and associated logic circuits, are required to cover each block. This method is known to be susceptible to external noise sources. This inductive loop method is described in greater detail in "Safety and Automatic Train Control for Rail Rapid Transit System", Jul. 1974, Report No. DOT-TSC-OST-74-4, pg B13.

A still further method of detecting trains is herein referred to as signal blocking. In this method, a distributed transmitting antenna is positioned on one side of the track over the full length of the block and a distributed receiving antenna is positioned on the other side of the track over the full length of the block. The transmitting antenna radiates at frequencies ranging from 1Mhz and up. As a train enters the block, the received signal is attenuated and appropriate detection control signals formed. Embodiments are also known where discrete transmitting antennas and receiving antennas are paired and are distributed over the length of the block. Appropriate logic circuits are provided to generate detection control signals when several receivers detect attenuation of the radiated signals. The signal blocking method is sensitive to environmental conditions, and further, requires that protection be provided against vandalism.

A still further known method of detecting a train within a block is herein referred to as "reflection signalling". This system is similar to the signal blocking method but differs in that the transmitter and receiver are on the same side of the track. As a train passes, the receiver detects energy reflected from the train and forms an appropriate detection control signal. This reflection signalling method is similar to the signal blocking method in that it is sensitive to environmental conditions and also requires that protection be provided against vandalism. Both the signal blocking method and the reflection signalling method are described in greater detail in "Safety and Automatic Train Control for Rail Rapid Transit Systems", July 1974, Report No. DOT-TSC-OST-74-4, pgs B13–B16.

Wheel sensor can also be used for detecting the presence of a train at a predetermined location within a block. For example, U.S. Pat. No. 3,721,821 describes a railway wheel sensor for detecting passage of a railway wheel. However, wheel detection systems, and other such detection system which monitor a specific point or a relatively small area, are inadequate for detecting the presence of a train within a large block unless multiple detectors are placed along the length of the block and appropriate logic circuits employed, thereby greatly increasing the complexity of the block system.

Highly sensitive fiber optic magnetometers for detecting very small magnetic fields are known. U.S. Pat. Nos. 4,603,296, 4,442,350, 4,378,497, 4,918,371, and 4,609,871, which are hereby incorporated by reference, describe various such magnetometers. Fiber optic magnetometers generally have a sensor arm which includes a first fiber optic cable having a magnetostrictive jacket, and a second fiber optic cable, without a magnetostrictive jacket, as a reference arm. A light source is projected through both the reference arm and the sensor arm. Magnetic fields imposed on the sensor arm cause the magnetostrictive jacket to constrict and thereby change the length and dimensions of the fiber optic cable in the sensor arm. Accordingly, when magnetic fields are present, due to the physical changes to the fiber optic cable in the sensor arm, the phase of the light in the sensor arm shifts relative to the phase of the light in the reference arm (which does not vary as a function of the applied magnetic field), and such variations in phase correspond to the magnitude of the magnetic field. Various known circuits are describe for detecting and measuring the resulting phase shifts.

Prior known high sensitivity fiber optic magnetometers have relatively short sensor heads (less than one meter) and require auxiliary current-carrying solenoids over the length of the sensor head. The purpose of the current carrying head, as described in an article entitled "Recent Developments in Fiber Optic Magnetostrictive Sensors", *Proc. S.P.I.E. -Int. Soc. Opt. Eng.* (USA), Vol. 1367, pp. 226–235 (1991), which is hereby incorporated by reference thereto, is threefold. First, it provides a D.C. bias magnetic field to optimize the magnetostrictive output. Second, a high frequency "dither" magnetic field reduces the effects of thermal noise. Third, a D.C. magnetic feedback field provides great linearity.

It should be noted, however, that the known fiber optic magnetometers are generally point detection magnetometers, in that the sensing arm and the reference arm are contained in the short sensor head, and are not distributed over a long distance. To detect magnetic fields across a large area, such as the mouth of a harbor, it is known to string a plurality of such point detection magneto meters together so as to create a detection wall for detecting incoming ships or submarines. However, the complexity and cost of such strings of magnetometers prohibits their use in commercial and industrial applications.

It is an object of the present invention to provide an improved apparatus, method and system which overcomes the above noted problems of the prior art for detecting the presence of any part of a train within a block.

It is a further object of the present invention to provide an apparatus, method and system in which a fiber optic magnetometer is used for detecting the presence of any part of a train within a block.

It is a still further object of the present invention to provide an apparatus, method and system in which a single fiber optic cable pair, comprising a sense arm and a reference arm, is placed along the length of a block, and form a sensor for detecting the presence of any part of the train within a block.

It is a still yet a further object of the present invention to provide an apparatus, method and system in which a single fiber optic cable pair comprising a sense arm and a reference arm form a distributed sensor for detecting magnetic field fluctuation over any portion of the distributed sensor.

SUMMARY OF THE INVENTION

The present invention is directed to a fiber optic line magnetometer for detecting the magnetic field form by a train positioned within a predetermined block of a train track. In one embodiment of the invention, the fiber optic line magnetometer comprises means for generating a light source, such as a laser diode. A reference arm means is optically coupled to the light source, where the reference arm means optically transmits the light source over the length of the reference arm and outputs a first optical signal. A sense arm means is optically coupled to the light source, where the sense arm means optically transmits the light source over the length of the sense arm and outputs a second optical signal. The sense arm means varies its optical transmission characteristics in response to the magnetic field of the train being applied thereto. The sense arm means and said reference arm means are positioned closely adjacent to each other, and both the sense arm means and the reference arm means are positioned substantially parallel to the train tracks over substantially the entire length of the predetermined block. Processing means are optically coupled to receive the first optical signal and the second optical signal and is arranged to output a detection signal when a phase shift between the first optical signal and the second optical signal exceeds a predetermined threshold.

In more detail, the sense arm means comprises a first fiber optic cable for optically transmitting the light source over the length of the sense arm means. A plurality of magnetostrictive elements, which varying in length as a function of the magnetic field applied thereto, are mechanically coupling to the first fiber optic cable in a manner such that changes in the length of the magnetostrictive elements causes changes in the length of the first fiber optic cable. Each of the plurality of magnetostrictive elements of the sense arm means have a first thermal expansion coefficient. The reference arm means comprises a second fiber optic cable for optically transmitting the light source over the length of the reference arm means. Mechanically attached to the second fiber optic cable are a plurality of non-magnetostrictive elements, each of the plurality of non-magnetostrictive elements having a second thermal expansion coefficient, where the ratio of the length of each of the plurality of magnetostrictive elements to the length of each of the plurality of non-magnetostrictive elements equals the first thermal expansion coefficient divided by the second thermal expansion coefficient. In this manner, temperature changes are reflected by equivalent changes in the optical paths of each of the first and second fiber optic cables.

BRIEF DESCRIPTION OF THE DRAWINGS

The features believed characteristic of the invention are set forth in the appended claims. The invention itself, however, as well as other features and advantages thereof, may best be understood by reference to the detailed description of a specific embodiment which follows, when read in conjunction with the accompanying drawings, wherein:

DETAILED DESCRIPTION OF A SPECIFIC EMBODIMENT

A number of specific embodiments of the invention are described herein. It will be understood that these embodiments are presented for the purpose of illustration and not as limiting the scope of the invention.

Figure 1:
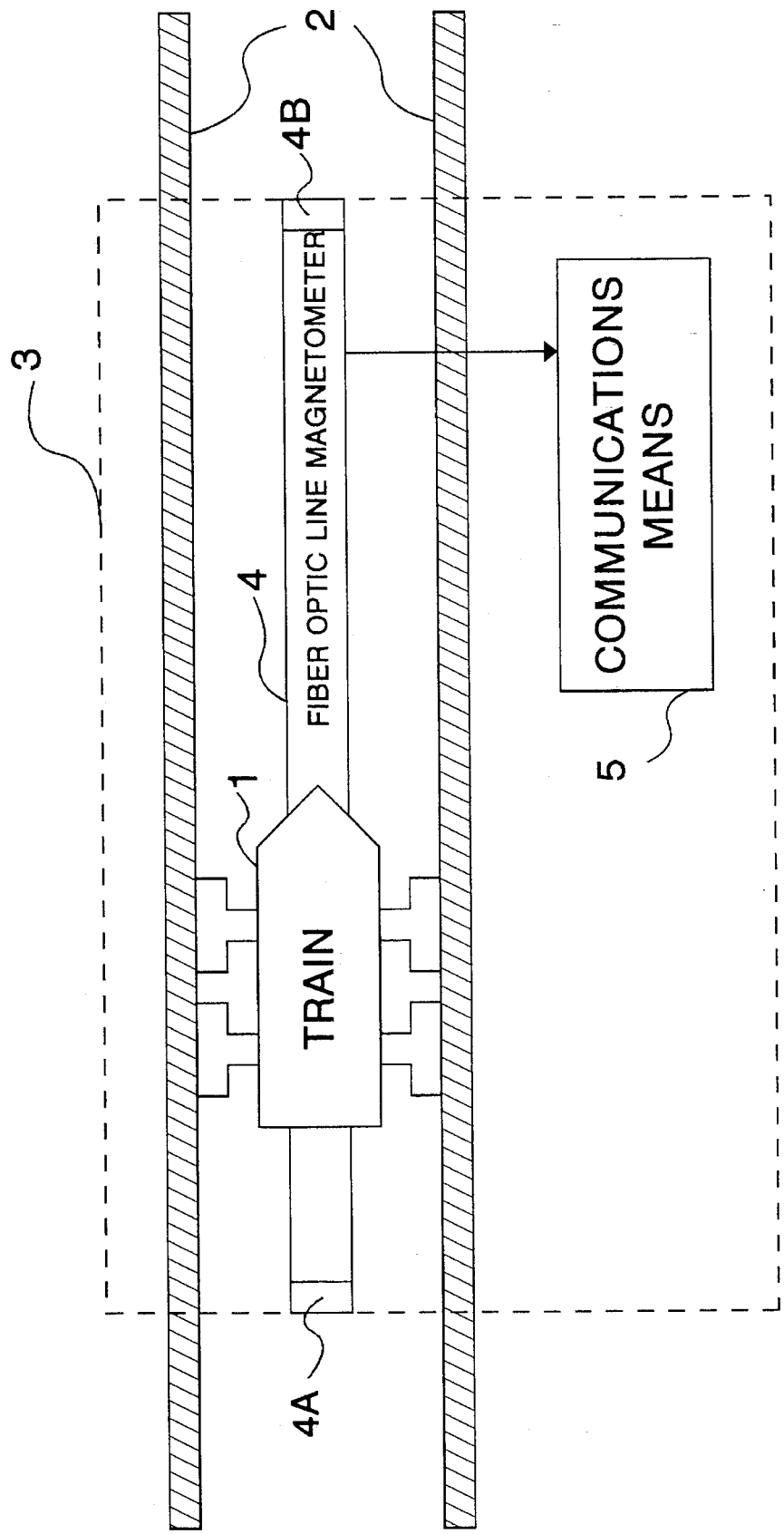
FIG. 1 illustrates a train block detection system in accordance with the present invention.

FIG. 1 illustrates a specific embodiment of single block 3 of a block system in accordance with the present invention.

Figure 2:
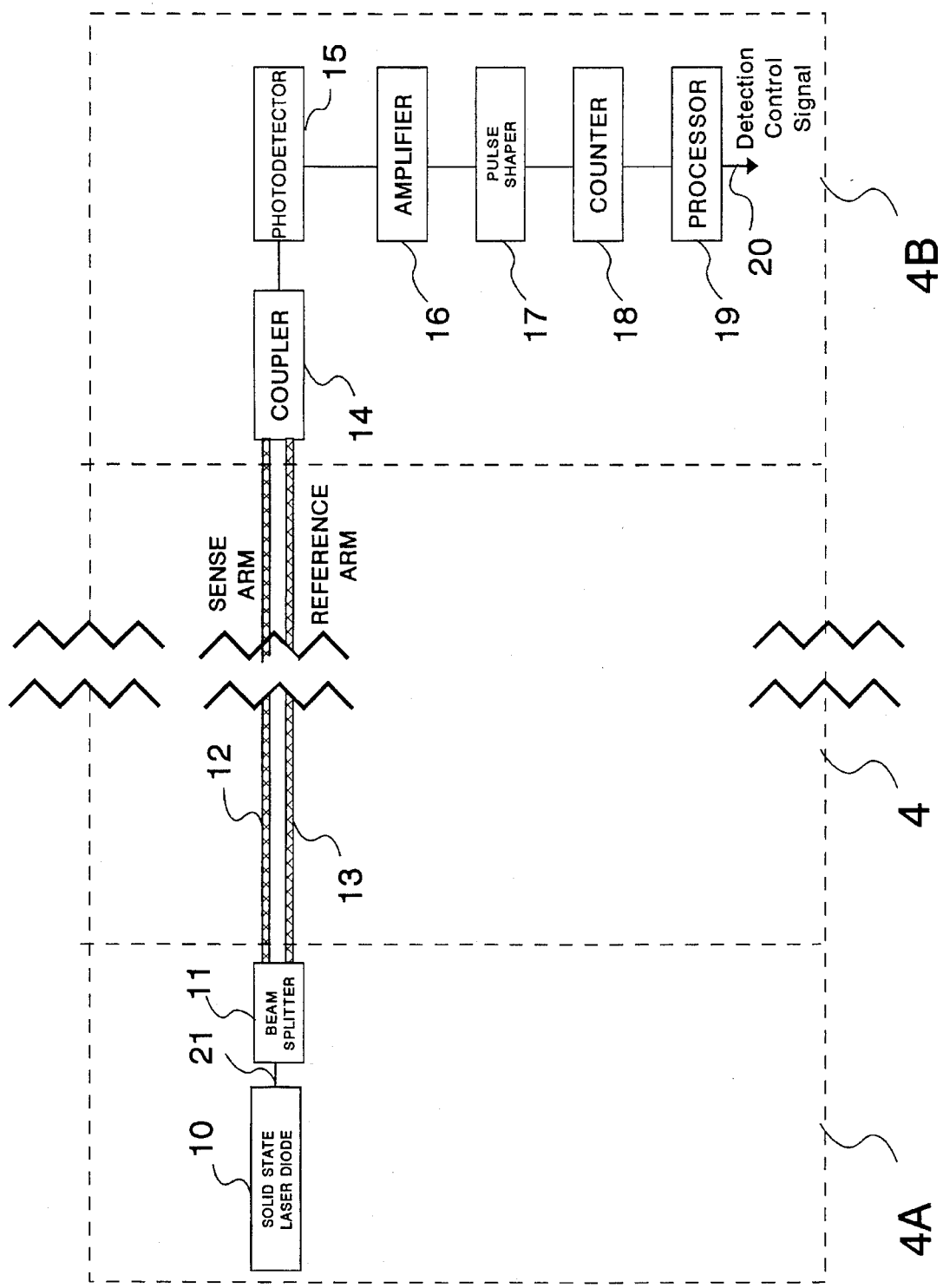
FIG. 2 shows in greater detail the fiber optic line magnetometer shown in FIG. 1.
Figure 3:
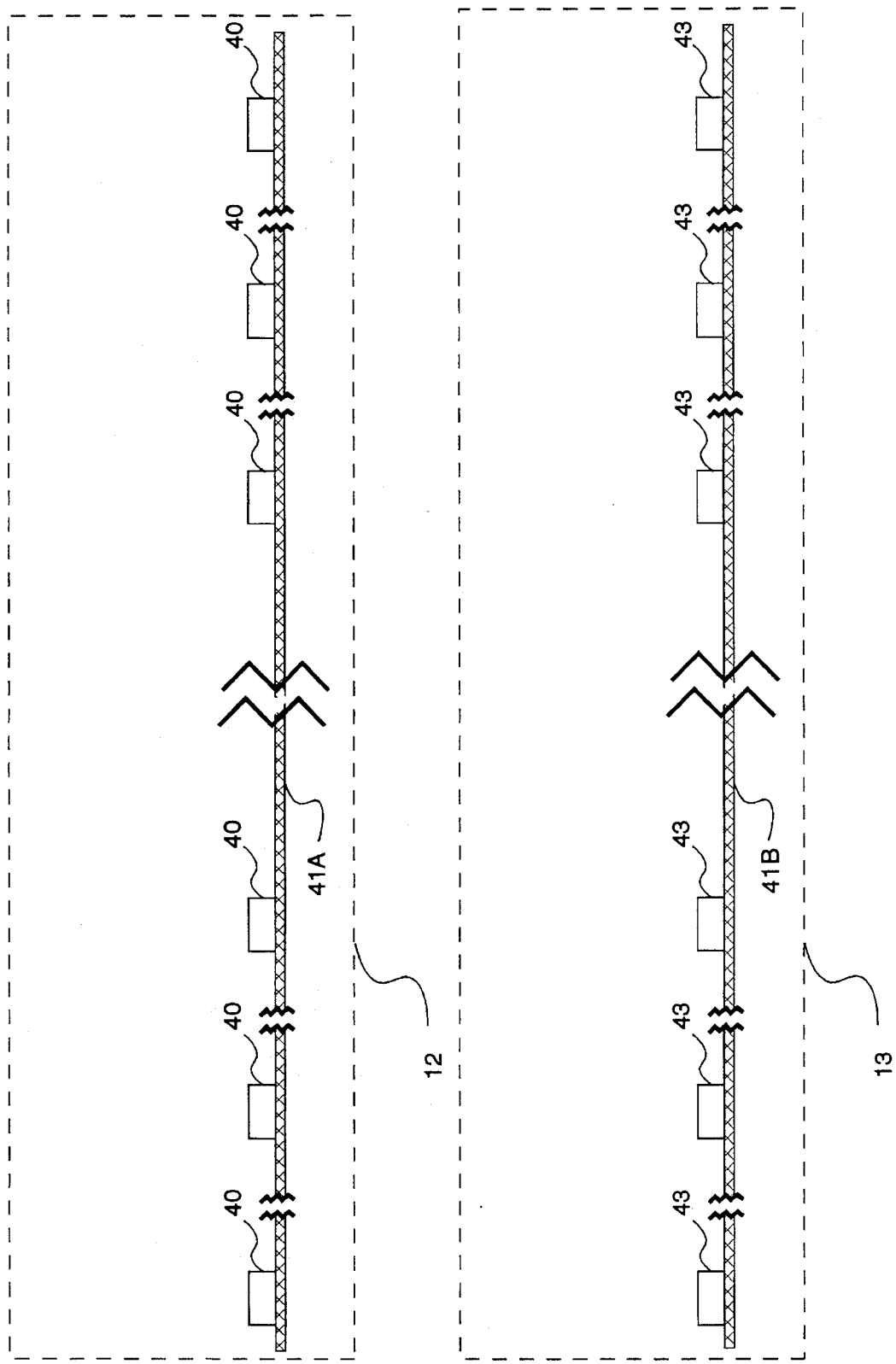
FIG. 3 shows in greater detail the sensor arm and the reference arm of the fiber optic line magnetometer of FIG. 1 and FIG. 2.

FIG. 1 shows a typical train track 2 for carrying a train 1. A fiber optic line magnetometer 4 is positioned in the center of the tracks and runs parallel to the tracks 2 for the length of the block 3. The fiber optic line magnetometer 4 comprises a light source 4A which is positioned at a first end of the block 3 and a processing unit 4B positioned at the second end of the block 3. The fiber optic line magnetometer 4, which will be described in greater detail with reference to FIG. 2 and FIG. 3, is capable of detecting the magnetic field formed by a train 1 when the entire train 1, or any portion of the train 1, is positioned within the block 3. The processing unit 4B of the fiber optic line magnetometer 4, upon detecting the presence of the train 1 within the block, generates a detection control signal for the communication means 5 which in turn communicates to control systems (not shown) of the type which are currently known in the art for providing visual, audible and controls relevant to an entire block control system.

FIG. 2 illustrates the fiber optic line magnetometer 4 of FIG. 1 in greater detail. The light source 4A, which is positioned at the first end of the block 3, includes a solid state laser diode 10 which generates and emits a coherent light beam. The coherent light beam output from the laser diode 10 is optically coupled into a single mode optical fiber 21 which, in turn, is optically coupled to the input of a beam splitter 11. The beam splitter 11 has two outputs, the first of which is optically coupled to a single mode fiber optic cable 41A (not shown in FIG. 2) in a sense arm 12. The second output of the beam splitter 11 is optically coupled to a single mode fiber optic cable 41B (not shown in FIG. 2) in a reference arm 13. The light from each output of the beam splitter 11 is coupled into the respective optical cable in the sense arm 12 and reference arm 13 in such a manner so that the light initially entering each arm is in phase.

The sense arm 12 and the reference arm 13 are place closely parallel to each other and extend for the length of the block 3 and terminate at a processing unit 4B positioned at the second end of the block 3. As will be described in greater detail later with reference to FIG. 3, external magnetic fields applied to any part of the sense arm 12 causes changes in the length o the light path, and therefore, it's phase is altered relative to the light in the reference arm 13. At the processing unit, the sense arm 12 and the reference arm 13 optically couple to coupler 14, and the coupler 14 outputs the sum of the light which exits from the sense arm 12 and the reference arm 13. The light output from the coupler 14 is optically coupled to a photodetector 15 which converts the light into an analog electrical signal representative of the light, which in turn, is supplied to an amplifier 16. The output of the amplifier 16 is supplied to a pulse shaper 17 which converts the analog waveform to a digital waveform representing the light output from the coupler 14. A counter 18 measures the number of successive pulses of the digital waveform and outputs the measured number to a processor 19 which outputs a detection control signal when it determines that a predetermined number of fringe shifts in the phase of the digital waveform has occurred.

FIG. 3 illustrates, as a specific embodiment of the present invention, the sense arm 12 and the reference arm 13 of FIG. 2 in greater detail. Note that FIG. 3 is not drawn to scale. The sense arm 12 and the reference arm 13 are 1000 meters in length. For this embodiment, the wavelength of light emitted from the solid state laser diode 10 is $500 \times 10^{-9}$ meters. The sensor arm 13 comprises a 1000 meter long single mode fiber optic cable 41A and the reference arm 13 comprises a 1000 meter long single mode fiber optic cable 41B. The reference arm 13 is not responsive to magnetic fields. To make the sensor arm 13 responsive to magnetic fields, strips of magnetostrictive materials 40, such as Metglas 2605CO (a product of Allied Signal), approximately 0.086 meters in length and approximately one inch in width, are attached by epoxy to the fiber optic cable 41A at one meter intervals. The magnetostrictive materials 40 respond to magnetic fields by changing their physical dimensions (magnetostriction), including, in particular, magnetostriction in the length dimension. The epoxy connecting the magnetostrictive material 40 to the fiber optic cable 41A is unyielding, and therefore, the length of the fiber optic cable 41A changes in correspondence with the changes in the length of the magnetostrictive material 40. Changes in the length of the fiber optic cable 41A result in shifts in the phase of the light transmitted therein relative to the phase of the light transmitted in the reference arm 13.

The length of the train 1 will be assumed to be 300 meters long and will be assumed to cause fringe shifts equivalent to path difference of ten wavelengths of the $500 \times 10^{-9}$ wavelength light emitted from the laser diode 10. Accordingly, the processor 19 of FIG. 2 will be arranged to produce a detection control signal upon detection of fringe shifts equivalent to path difference of 10 wavelengths (a path difference of $50 \times 10^{-7}$).

The demagnetization factor of the magnetostrictive material 40 (Metglas 2605CO) in the long axis is approximately 0.01. Accordingly, if D is the demagnetization factor, $H_{ex}$ is the external field in oersteds, and the internal flux density B, in gauss, is given approximately by the equation $B=(\mu_o*H_{ex})/D$, where $\mu_o$ is the permeability of the vacuum. If the train 1 results in a field $H_{ex}$ of 1 oersted, then the resulting flux density, B, in the magnetostrictive material is 100 gauss. For this material the saturation induction is 18 kilogauss. Assuming approximate linearity, the magnetostriction will be $(100/(18 \times 10^3)) * (35 \times 10^{-6})$, where $35 \times 10^{-6}$ is the saturation magnetostriction. Hence the magnetostriction caused by the train=$\Delta$ 1/1=$1.94 \times 10^{-7}$.

If the total length change, $\Delta$l, is $50 \times 10^{-7}$ meter, 1 is given by $1=(50 \times 10^{-7})/(1.94 \times 10^{-7})=25.8$ meters.

The 25.8 meters represents the length of magnetostrictive material 40 (Metglas 2605CO) which must be present in the 300 meter length of fiber optic cable 41A present under the train 1. Accordingly, 8.6% (25.8 meter/300 meter) of the fiber optic cable 41A must have attached thereto the magnetostrictive material 40. To comply with this 8.6% requirement, the magnetostrictive material lengths are 0.086 meters and are spaced at one meter intervals.

Fiber optic cables, such as 41A and 41B, change path lengths when subject to temperature variations. Further, the magnetostrictive material 40 connected by epoxy to the sense arm 12 of the fiber optic cable 41A also changes in length as a function of temperature (Metglas 2605CO has a thermal expansion coefficient of 8.6 pm/° C). So as to eliminate the effects of changes in lengths due to temperature fluctuations, the fiber optic cable 41B in the reference arm 13 has attached thereto non-magnetostrictive materials 43, which are selected to be of lengths such that they have thermal expansion properties similar to the magnetostrictive material 40, but which have zero saturation magnetostriction. Accordingly, the changes in path length in the sense arm 12 fiber optic cable 41A and the reference arm 13 fiber optic cable 41B are the same provided they are at similar temperatures. By placing the sense arm 12 and the reference arm 13 closely in parallel, each is subjected substantially to the same temperatures, and therefore are subject to equivalent changes in path lengths.

In this specific embodiment, Metglas 2705M (a product of Allied Signal) is used as the non-magnetostrictive materials 43 attached to the reference arm 13 by epoxy. The thermal expansion coefficient is 12.1 ppm/° C. For similar thermal expansions of the magnetostrictive material 40 (Metglas 2605CO) and the non-magnetostrictive materials 43 (Metglas 2705M), the length of each non-magnetostrictive materials 43 shall be equal to:

$$= \text{Length Metglas 2605CO} * \frac{(\text{Temp. expansion coefficient Metglas 2605CO})}{(\text{Temp. expansion coefficient Metglas 2705M})}$$
$$= 0.086 * (8.6)/12.1 = 0.061 \text{ meters}$$

The sense arm 12 and reference arm 13 of the above described fiber optic line magnetometer 4, when used for block detection of trains, can be contained in a protective housing, such a long plastic pipe (not shown in drawings), where the plastic pipe is physically attached to the top of the railway ties along the length of the block 3. Alternatively, the sense arm 12 and the reference arm 13 can be buried several inches under the center of the tracks, thereby providing enhanced vandalism protection and minimizing the temperature variations as a function of time due to the surrounding volume of dirt.

As can be appreciated, the fiber optic line magnetometer 4 differs from methods previously used for block detection of trains in that electrical noises, which is often present at the track location, has no effect on the phase of the light passing through the arms 12 and 13 of the fiber optic line magnetometer 4.

Figure 5:
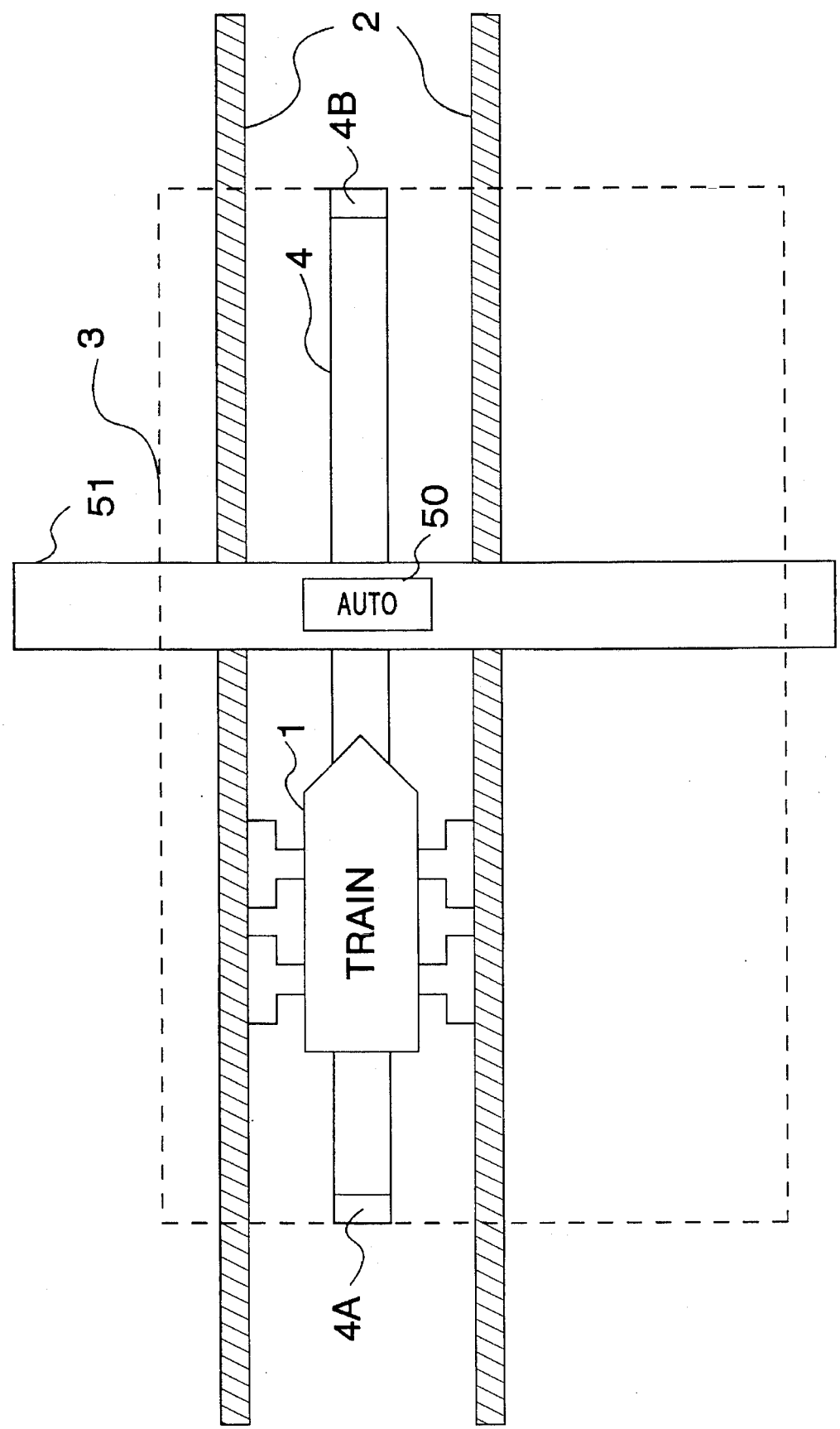
FIG. 5 illustrates a train block detection system which includes grade crossing detection in accordance with the present invention.

A still further embodiment of the present invention is directed to the detection of vehicles at train grade crossings. FIG. 5 shows a block 3 of a block detection system similar to that described in FIG. 1, except that a road 5 1 crosses the tracks 2. Components of FIG. 5 which are the same as those in FIG. 1 are similarly numbered, and therefore, repeated description thereof is omitted. To prevent vehicles from entering a block 3 when a train 1 is approaching the block, it is known in the art to use physical barriers, such as moveable grade crossing barriers (not shown), to restrict access to the track crossing. However, in the event a vehicle 1 stalls on the track, it is desirous to detect the presence of the vehicle 1 on the track and then to take appropriate action.

Assuming for this embodiment, the vehicle 1, when positioned over the fiber optic line magnetometer 4, has a total magnetostrictive effect which is one hundred times smaller than the magnetostrictive effect of the train because the vehicle interacts with much less magnetostrictive material (magnetostrictive elements 40) as compared to the interaction when the train is positioned over the fiber optic line magnetometer 4. As described previously, when the field $H_{ex}$ (1 oersted) of the train is applied to the fiber optic line magnetometer 4, a fringe shifts equivalent to path difference of ten wavelengths occurs between the sense arm 12 and the reference arm 13. When the field of about 1 oersted of the vehicle is applied to the fiber optic line magnetometer 4, a fringe shift equivalent to a path difference of 0.1 wavelengths occurs between the sense arm 12 and the reference arm 13. Accordingly, the processor 19 can be arranged to generate a train detection control signal when the fringe shift is determined to be greater than 10 wavelengths, and to generate a vehicle detection control signal when the fringe shift is determined to be greater than 0.1 wavelengths.

Figure 6:
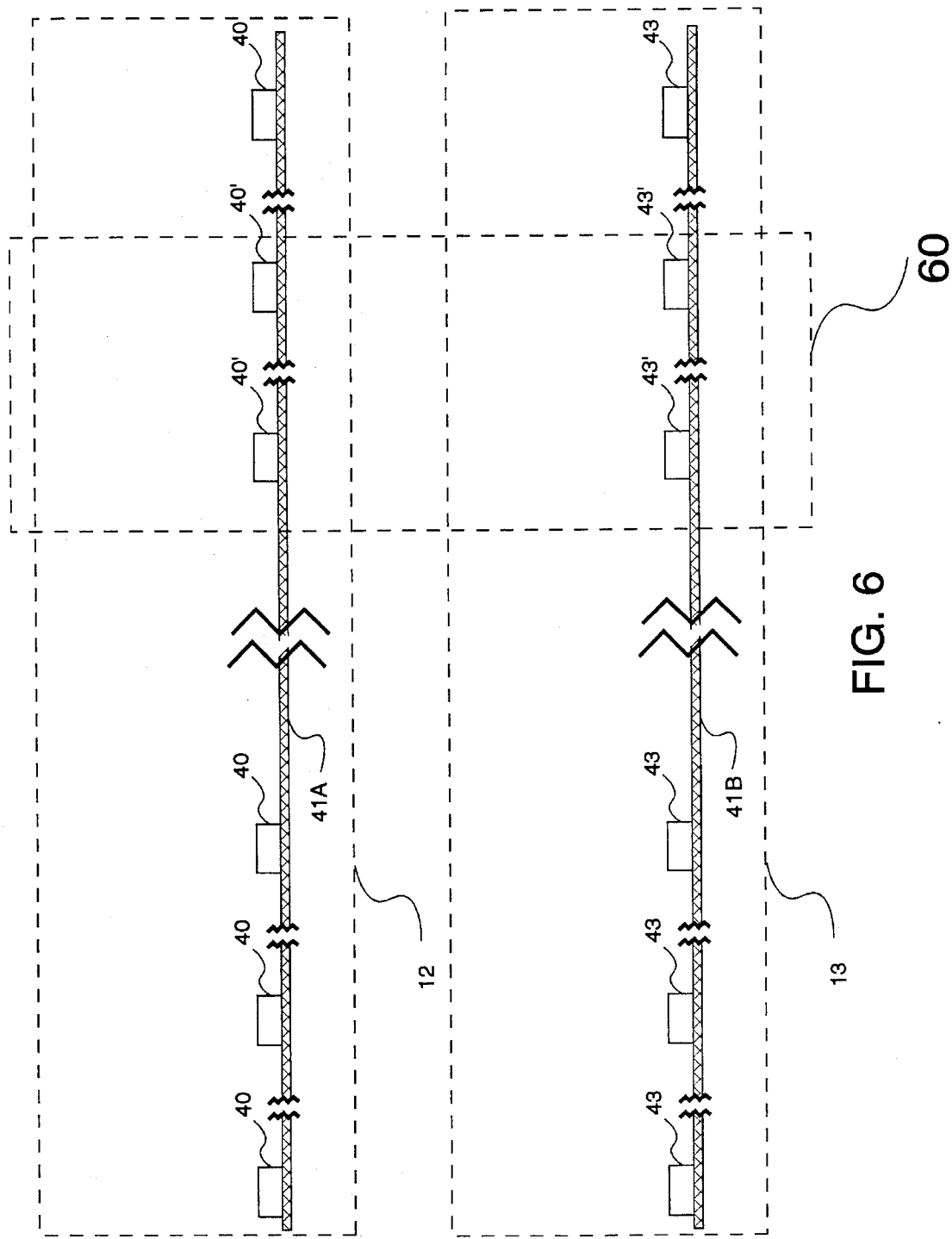
FIG. 6 illustrates in detail a specific embodiment of the sensor arm and the reference arm of the fiber optic line magnetometer of FIG. 5.

In accordance with the present invention, it is possible to design the fiber optic line magnetometer 4 so that it has an enhanced sensitivity to magnetic fields at positions along the track that correspond to the grade crossing. FIG. 6 is a specific embodiment of a sense arm 12 and reference arm 13 of an magnetometer in which the sensitivity of the sense arm 12 is increased at the region of the grade crossing 60. Over the length of the sense arm 12, except at the grade crossing, the length of each magnetostrictive element 40 (0.086 meters) is the same as previously described in FIG. 3. However, where the sense arm 12 passes over the grade crossing 60, the length of each magnetostrictive element 40' is increased by a factor of ten to 0.86 meters. Accordingly, the sensitivity of the region at the grade crossing is also increased by a factor of ten. Therefore, in the event a vehicle passes over the grade crossing 60, due to the ten time increased sensitivity of the fiber optic line magnetometer 4 at the region of the grade crossing 60, the resulting fringe shifts are equivalent to path difference of 1 wavelengths (as compared to the shift of 0.1 wavelength of the magnetometer of FIG. 3).

Over the length of the reference arm 13, except at the grade crossing 60, the length of each non-magnetostrictive element 40 (0.061 meters) for temperature compensation remains the same as previously described in FIG. 3. However, at the grade crossing, the length of each non-magnetostrictive element 43' is increased by a factor of ten (0.61 meters), and therefore matches the temperature variations in the lengthwise direction of the magnetostrictive elements 40'.

As can be appreciated, while the above specific embodiments illustrated specific lengths for the magnetostrictive elements and the non-magnetostrictive elements, in accordance with the present invention the lengths and distribution of the elements along the length of the fiber optic line magnetometer can be varied so as to provide varying regions of sensitivity. Further, the length of the fiber optic line magnetometer can be increased or decreased accordingly. However, in all cases, the non-magnetostrictive elements must be appropriately selected so that the temperature characteristics of the sense arm 12 matches the temperature characteristics of the reference arm 13.

Figure 7:
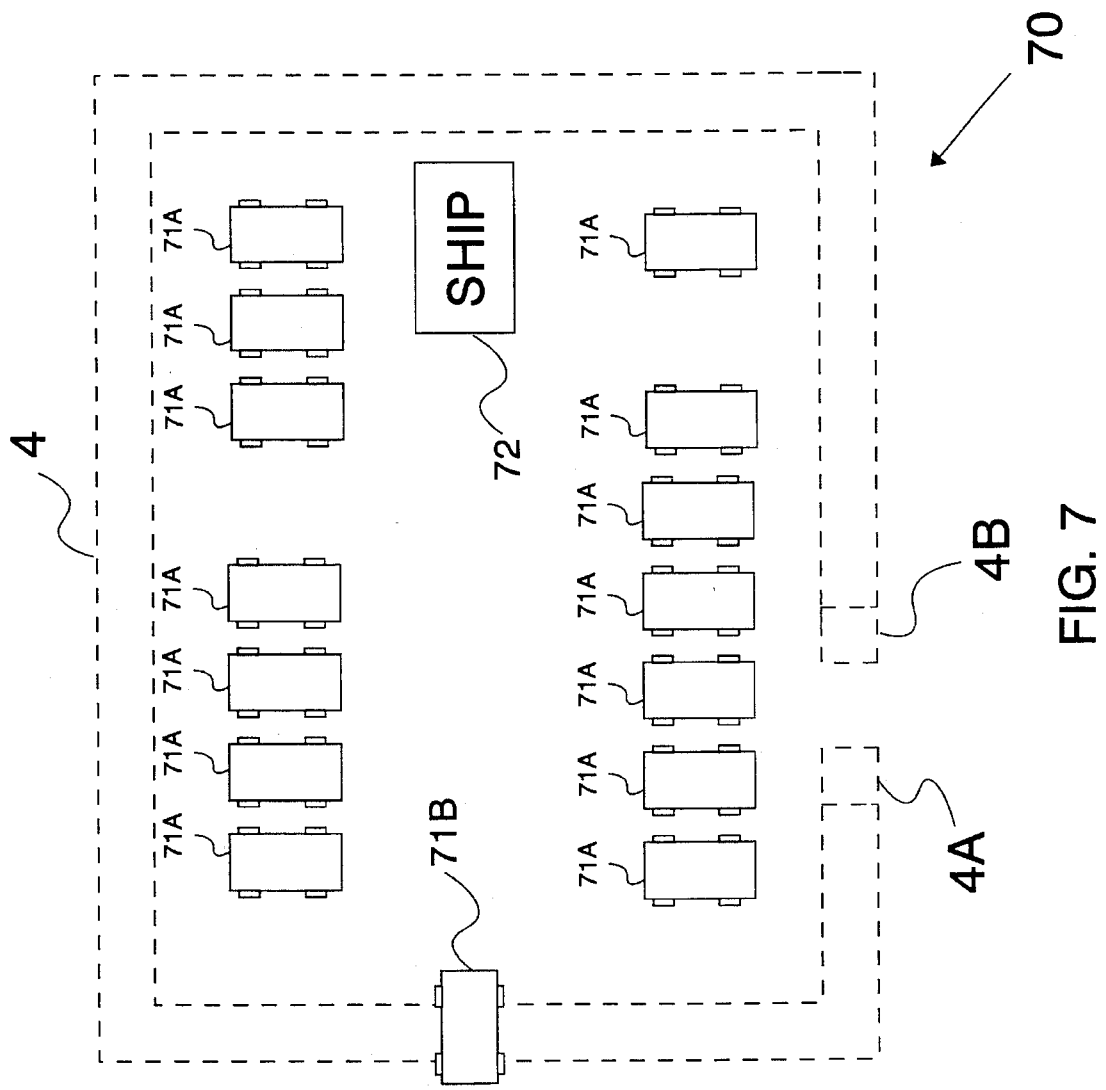
FIG. 7 illustrates a parking lot surveillance system in accordance with the present invention.

FIG. 7 shows yet a further embodiment of the present invention. A parking lot 70 is surrounded by a fiber optic line magnetometer 4 similar to that shown in FIGS. 2 and 3. The magnetometer 4 may be buried under the ground so as to provide physical protection, or may be encased in a plastic tubing. Parked cars 71A are parked within the inside of the parking lot 70 and away from the fiber optic line magnetometer 4. For a car 71B to enter or leave the parking lot 70 it must traverse the fiber optic line magnetometer 4, where the magnetic field $H_{ex}$ of the car is detected by the line magnetometer 4, and a appropriate detection control signal is formed.

While the specific examples of the present invention have shown the fiber optic line magnetometer 4 applied to train block detection and parking lot surveillance system, the fiber optic line magnetometer 4 can be used in any application in which low accuracy distributed magnetic field detection is desirable over a long distance. For example, the fiber optic line magnetometer 4 can be spread across an inlet or bay so as to detect the passage of ships therethrough. As a further example, the fiber optic line magnetometer 4 can be installed under roadways to detect the traffic flow of vehicles.

Figure 4:
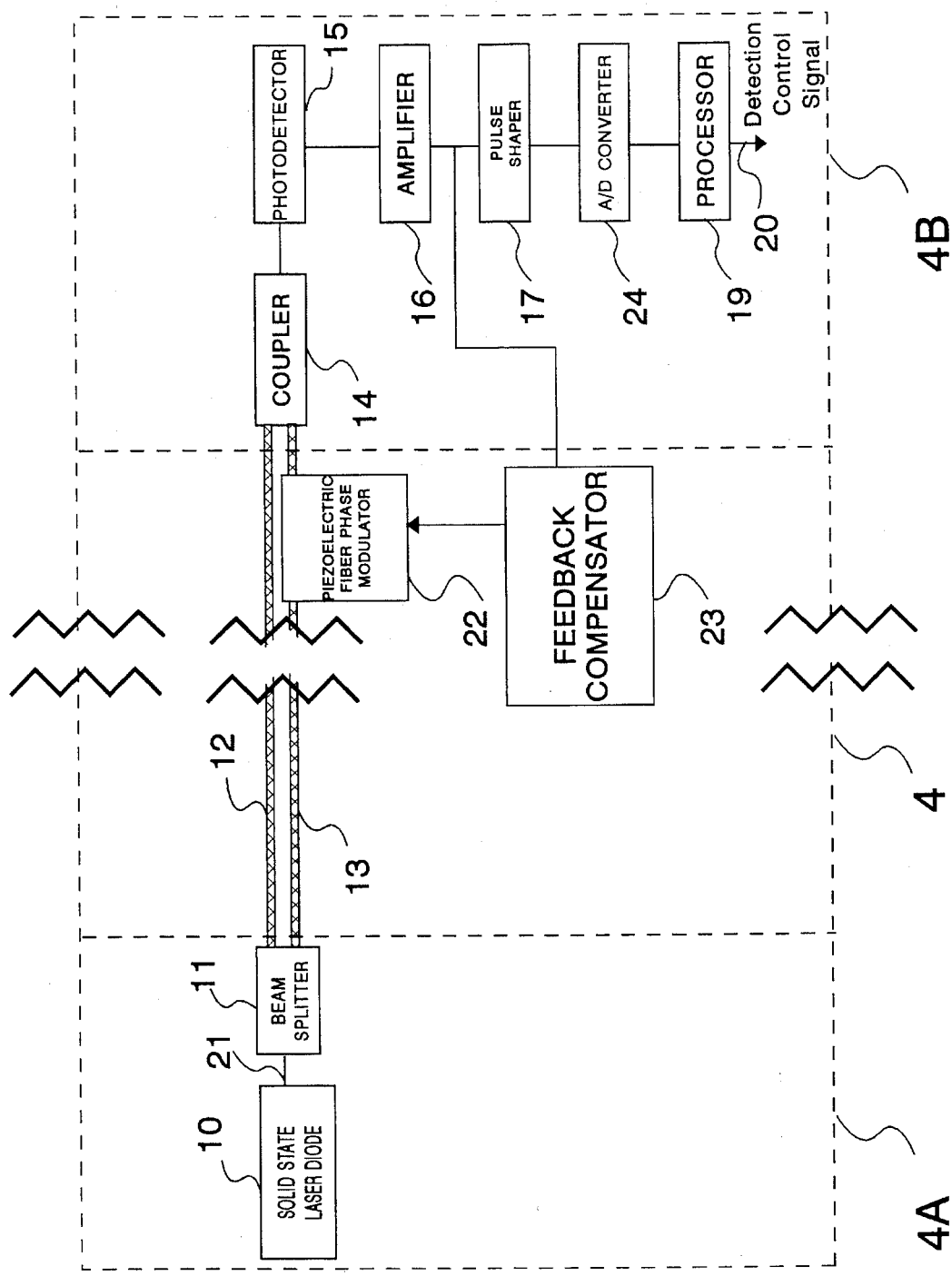
FIG. 4 shows a further embodiment of the fiber optic line magnetometer in accordance with the present invention.

As a further embodiment of the present invention, FIG. 4 shows a fiber optic line magnetometer 4 which is substantially similar to that described in FIG. 2. Components of FIG. 4 which are the same as those in FIG. 2 are similarly numbered, and therefore, repeated description thereof is omitted. A piezoelectric fiber phase modulator 22 is inserted in the reference arm 13, preferably at a position immediately before the coupler 14. The piezoelectric fiber phase modulator 22 is controlled by feedback compensator means 23, which receives the output of the amplifier 16. The feedback compensator means 23 is arranged to control the modulator 22 in such a manner that a zero phase difference exists between the light output of sense arm 12 and the light output from the reference arm 13. The voltage of the signal output from the amplifier 16 which is required to maintain the zero phase difference, is a measure of the average magnetic field over the lenght of the fiber. Accordingly, the output of the amplifier is provided to an A/D converter 24 which in turn provides a digital representation of the voltage (and therefore the average magnetic field) to the processor 19. The processor 19 forms a detection control signal when the digital representation of the voltage reaches predetermined thresholds.

In all cases, it is understood that the above-described arrangements are merely illustrative of the many possible specific embodiments which represent applications of the present invention. Numerous and varied other arrangements can be readily devised in accordance with the principles of the present invention without departing from the spirit and scope of the invention. Thus, while specific processing units 4B have been shown, there are many known alternative circuits and arrangements for determining phase differences between two halves of a split beam of light which can be utilized in accordance with the present invention. Further, while specific examples of magnetostrictive elements 40 have been shown, any element which has magnetostrictive characteristics can be utilized in accordance with the present invention. Still further, while the present invention describes connecting the magnetostrictive elements 40 and the non-magnetostrictive elements 43 to the fiber optic cable 41A by epoxy, as an alternative embodiment, the elements can encase the fiber optic cable 41A.

What is claimed is:

1. A fiber optic line magnetometer for detecting the magnetic field form by a train positioned within a predetermined block of a train track, the fiber optic line magnetometer comprising;
   a. means for generating a light source:
   b. reference arm means optically coupled to said light source, said reference arm means optically transmitting said light source over the length of said reference arm and outputting a first optical signal;
   c. sense arm means optically coupled to said light source, said sense arm means optically transmitting said light source over the length of said sense arm and outputting a second optical signal, said sense arm means varying optical transmission characteristics in response to the magnetic field of the train being applied thereto;
   said sense arm means and said reference arm means being positioned closely adjacent to each other, both said sense arm means and said reference arm means position substantially parallel to the train tracks over substantially the entire length of the predetermined block; and
   d. a processing means optically coupled to receive said first optical signal and said second optical signal, said processing means arranged to output a detection signal when a phase shift between said first optical signal and said second optical signal exceeds a predetermined threshold,
   wherein said sense arm means comprises;
   a. a first fiber optic cable for optically transmitting the light source over the length of the sense arm means;
   b. a plurality of magnetostrictive elements, each of said plurality of magnetostrictive elements varying in length as a function of the magnetic field applied thereto; and
   c. mechanical coupling means for mechanically coupling each of said plurality of magnetostrictive elements to said first fiber optic cable in a manner such that changes in the length of the magnetostrictive elements causes changes in the length of the first fiber optic cable, and
   wherein said plurality of magnetostrictive elements of said sense arm means have a first thermal expansion coefficient, and wherein said reference arm means comprises;
   a. a second fiber optic cable for optically transmitting the light source over the length of the reference arm means;
   b. a plurality of non-magnetostictive elements, each of said plurality of non-magnetostrictive elements having a second thermal expansion coefficient, said ratio of the length of each of said plurality of magnetostrictive elements to the length of each of said plurality of non-magnetostrictive elements equals said first thermal expansion coefficient divided by said second thermal expansion coefficient; and
   c. mechanical coupling means for mechanically coupling each of said plurality of non-magnetostrictive elements to said second fiber optic cable in a manner such that changes in the length of the non-magnetostrictive elements causes changes in the length of the second fiber optic cable.

2. A fiber optic line magnetometer in accordance with claim 1 wherein said processing means comprises:
   a. photodetection means for converting said first optical signal and said second optical signal into first and second electrical signals;
   b. processor means for comparing said first and said second electrical signals and for generating said detection signal when a phase shift between said first electrical signal and said second optical signal exceeds a predetermined threshold.

3. A fiber optic line magnetometer in accordance with claim 2 wherein said means for generating a light source is a solid state diode which generates and emits a coherent light beam.

4. A fiber optic line magnetometer in accordance with claim 1 where said mechanically coupling means for coupling each of said plurality of magnetostrictive element to said first fiber optic cable is epoxy and said mechanically coupling means for coupling each of said plurality of non-magnetostrictive element to said second fiber optic cable is epoxy.

5. A fiber optic line magnetometer in accordance with claim 1, wherein the plurality of magnetostrictive elements equals in quantity the plurality non-magnetostrictive elements, and wherein each one of the plurality of magnetostrictive elements is positioned closely parallel to a corresponding one of the plurality of non-magnetostrictive elements.

6. A fiber optic line magnetometer in accordance with claim 5 wherein said plurality of magnetostrictive elements are evenly distributed over the length of the first fiber optic cable and said plurality of non-magnetostrictive elements are evenly distributed over the length of the second fiber optic cable.

7. A fiber optic line magnetometer in accordance with claim 5 which is further arrange to detect a vehicle positioned at a grade crossing of the train tracks wherein the spacing between said plurality of magnetostrictive elements positioned at the grade crossing is less than the spacing between said plurality of magnetostrictive elements positioned other than at the grade crossing.

8. A fiber optic line magnetometer in accordance with claim 5 wherein said plurality of magnetostrictive elements are Metglas 2605CO and said plurality of non-magnetostrictive element are Metglas 2705M.

9. A fiber optic line magnetometer for detecting the magnetic fields at any position along the length of the fiber optic line magnetometer, the fiber optic line magnetometer comprising;

a. means for generating a light source;
   b. reference arm means optically coupled to said light source, said reference arm means optically transmitting said light source over the length of said reference arm and outputting a first optical signal;
   c. sense arm means optically coupled to said light source, said sense arm means optically transmitting said light source over the length of said sense arm and outputting a second optical signal, said sense arm means varying optical transmission characteristics in response to the magnetic field applied thereto;
   said sense arm means and said reference arm means being positioned closely adjacent to each other; and
   d. a processing means optical coupled to receive said first optical signal and said second optical signal, said processing means arranged to output a detection signal when a phase shift between said first optical signal and said second optical signal exceeds a predetermined threshold, wherein said sense arm means comprises;

a. a first fiber optic cable for optically transmitting the light source over the length of the sense arm means;
   b. a plurality of magnetostrictive elements, each of said plurality of magnetostrictive elements varying in length as a function of the magnetic field applied thereto: and
   c. mechanical coupling means for mechanically coupling each of said plurality of magnetostrictive elements to said first fiber optic cable in a manner such that changes in the length of the magnetostrictive elements causes changes in the length of the first fiber optic cable, and wherein said plurality of magnetostrictive elements of said sense arm means have a first thermal expansion coefficient, and wherein said reference arm means comprises;

a. a second fiber optic cable for optically transmitting the light source over the length of the reference arm means;
   b. a plurality of non-magnetostrictive elements, each of said plurality non-magnetostrictive elements having a second thermal expansion coefficient, said ratio of the length of each of said plurality of magnetostrictive elements to the length of each of said plurality of non-magnetostrictive elements equals said first thermal expansion coeeficient divided by said second thermal expansion coeeficient; and
   c. mechanical coupling means for mechanically coupling each of said plurality of non-magnetostrictive elements to said second fiber optic cable in a manner such that changes in the length of the non-magnetostrictive elements causes changes in the length of the second fiber optic cable.

10. A fiber optic line magnetometer in accordance with claim 9 wherein the plurality of magnetostrictive elements equals in quantity the plurality non-magnetostrictive elements, and wherein each one of the plurality of magnetostrictive elements is positioned closely parallel to a corresponding one of the plurality of non-magnetostrictive elements.

11. A fiber optic line magnetometer in accordance with claim 10 wherein said plurality of magnetostrictive elements are evenly distributed over the length of the first fiber optic cable and said plurality of non-magnetostrictive elements are evenly distributed over the length of the second fiber optic cable.

12. A fiber optic line magnetometer in accordance with claim 9 arranged to detected vehicle entering or exiting from a parking lot, wherein said sense arm means and said reference arm means substantially surround the parking lot.

13. A fiber optic line magnetometer in accordance with claim 9 arranged to detected ships entering the mouth of a harbor, wherein said sense arm means and said reference arm means traverse the mouth of the harbor.

14. A fiber optic line magnetometer in accordance with claim 9 arranged to detected vehicles on a roadway, wherein said sense arm means and said reference arm means are positioned under the roadway.

15. A fiber optic line magnetometer in accordance with claim 9 wherein the length of fiber optic line magnetometer is greater than two meters.

\* \* \* \* \*